(12) United States Patent
Bedarida et al.

(10) Patent No.: US 7,782,695 B2
(45) Date of Patent: Aug. 24, 2010

(54) COMPENSATED CURRENT OFFSET IN A SENSING CIRCUIT

(75) Inventors: Lorenzo Bedarida, Vimercate (IT); Gabriele Pelli, Mortara (IT); Simone Bartoli, Cambiago (IT); Mauro Chinosi, Burago Di Molgora (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/652,742

(22) Filed: Jan. 12, 2007

(65) Prior Publication Data

US 2008/0170455 A1 Jul. 17, 2008

(51) Int. Cl.
*G11C 7/00* (2006.01)

(52) U.S. Cl. ............... 365/205; 365/185.2; 365/185.21; 365/210.1

(58) Field of Classification Search ................. 365/185, 365/205, 207, 210, 210.1, 185.2, 185.21
See application file for complete search history.

(56) References Cited

U.S. PATENT DOCUMENTS

| | | | |
|---|---|---|---|
| 5,013,943 A | | 5/1991 | Hirose |
| 5,056,063 A | | 10/1991 | Santin et al. |
| 5,408,148 A | * | 4/1995 | Pascucci et al. ............... 327/52 |
| 5,495,191 A | | 2/1996 | Lev et al. |
| 5,579,274 A | * | 11/1996 | Van Buskirk et al. .. 365/185.21 |
| 6,052,307 A | | 4/2000 | Huber et al. |
| 6,128,225 A | * | 10/2000 | Campardo et al. ....... 365/185.2 |
| 6,205,057 B1 | * | 3/2001 | Pan ........................ 365/185.21 |
| 6,330,188 B1 | * | 12/2001 | Pascucci ................. 365/185.2 |
| 6,535,428 B2 | * | 3/2003 | Pasotti et al. ........... 365/185.21 |
| 6,535,429 B2 | * | 3/2003 | Conte et al. ............. 365/185.21 |
| 6,711,080 B2 | * | 3/2004 | Kern et al. .............. 365/189.15 |
| 6,791,880 B1 | * | 9/2004 | Kurihara et al. ........ 365/185.21 |
| 6,795,350 B2 | * | 9/2004 | Chen et al. .............. 365/189.07 |
| 6,885,604 B1 | * | 4/2005 | Ott .......................... 365/225.7 |
| 7,031,212 B2 | | 4/2006 | La Rosa |
| 2004/0047184 A1 | | 3/2004 | Tran et al. |
| 2005/0132119 A1 | | 6/2005 | Chan et al. |
| 2005/0237810 A1 | | 10/2005 | Vali et al. |

FOREIGN PATENT DOCUMENTS

WO WO 2008089158 A2 7/2008

OTHER PUBLICATIONS

"International Application Serial No. PCT/US2008/051024, Search Report and Written Opinion mailed on Sep. 08, 2008.", 9 pages.

* cited by examiner

*Primary Examiner*—Huan Hoang
(74) *Attorney, Agent, or Firm*—Schwegman, Lundberg & Woessner, P.A.

(57) ABSTRACT

A sensing circuit with current offset functionality. In one embodiment, the sensing circuit includes a memory circuit having a first offset circuit operative to offset a first current. The sensing circuit also includes a reference circuit coupled to the memory circuit, where the reference circuit includes a second offset circuit operative to offset a second current. The sensing circuit also includes a compare circuit coupled to the memory circuit and the reference circuit, where the compare circuit determines the state of a memory cell based on first current and the second current. According to the system disclosed herein, the first and second offset circuits optimize the performance of the sensing circuit and prevent errors when determining the state of the memory cell.

13 Claims, 6 Drawing Sheets

COMPENSATED CURRENT OFFSET IN A SENSING CIRCUIT

FIELD OF THE INVENTION

The present invention relates to computer systems, and in particular to non-volatile memories.

BACKGROUND OF THE INVENTION

Non-volatile memories are well known. Generally, a non-volatile memory is a computer memory that can retain stored information (e.g., a "0" bit or a "1" bit) even when the non-volatile memory is not powered. Flash memories and read-only memories are examples of non-volatile memories. Conventional non-volatile memories typically include multiple memory cells (e.g., flash memory cells) that are usually organized by rows and columns inside an array. Typically, the gates of a given memory cells are connected to one row of the array and the drains of the memory cells are connected to a column. To select a given memory cell, the memory cell is precharged/polarized at both the row to which it is connected (i.e., to polarize its gate) and the column/bitline to which it is connected (i.e., to polarize its drain). As discussed below, there are potential problems associated with the polarization of the bitline/drain of the selected memory cell.

In order to polarize (or precharge) the drain of the selected memory cell to the correct value, the bitline to which the drain is connected needs to be polarized to the correct value. Because of the size (and thus high capacitance) of the bitlines of a memory array, larger transistors are required to quickly polarize the bitline and drain of the selected memory cell. These large transistors are able to sink high current to the selected bitline to quickly precharge it and the drain to the correct value. There are several problems with conventional non-volatile memory systems using large transistors. For example, the very high current of large transistors can induce a voltage overshoot at the drain of the memory cell. A voltage overshoot may cause an erroneous reading of a given memory cell. For example, a memory cell containing a "1" bit may be erroneously read as carrying a zero bit, and vice versa.

Accordingly, what is needed is an improved sensing circuit. The present invention addresses such a need.

SUMMARY OF THE INVENTION

A sensing circuit is disclosed. In one embodiment, the sensing circuit includes a memory circuit that includes a first offset circuit operative to offset a first current. The sensing circuit also includes a reference circuit coupled to the memory circuit, wherein the reference circuit includes a second offset circuit operative to offset a second current. The sensing circuit also includes a compare circuit coupled to the memory circuit and the reference circuit, wherein the compare circuit determines the state of a memory cell based on first current and the second current.

According to the system disclosed herein, the first and second offset circuits optimize the performance of the sensing circuit and prevent errors when determining the state of the memory cell.

DETAILED DESCRIPTION OF THE INVENTION

The present invention relates to computer systems, and in particular to non-volatile memories. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A sensing circuit in accordance with the present invention is disclosed. The sensing circuit includes a memory circuit that has an offset circuit that offsets the current of a selected memory cell. The sensing circuit also includes a reference circuit that has an offset circuit that offsets the current of a reference cell. The sensing circuit also includes a compare circuit that compares the current of the selected memory cell to the current of the reference cell, where the difference between the currents determines the state of the memory cell (i.e., whether the memory cell is programmed or erased). The offset circuits offset the currents of the memory cell and the reference cell such that the offset currents speed up the behavior of large load and cascode transistors in the sensing circuit in a quick and efficient manner and prevent voltage overshoots at the drain of the memory cell. Because the sense circuitry is faster, embodiments are significantly useful even in the cases without cascode transistors. To more particularly describe the features of the present invention, refer now to the following description in conjunction with the accompanying figures.

Although the present invention disclosed herein is described in the context of flash memory cells, the present invention may apply to other types of memory cells, and still remain within the spirit and scope of the present invention.

The following describes the principles of the embodiments of the present invention. One method for reading data from a memory cell of a memory array is to compare the current at the memory cell to the current at a reference cell. As described in more detail below, the difference between the two currents determines the state of the memory cell (i.e., whether the memory cell is programmed or erased).

Figure 1A:
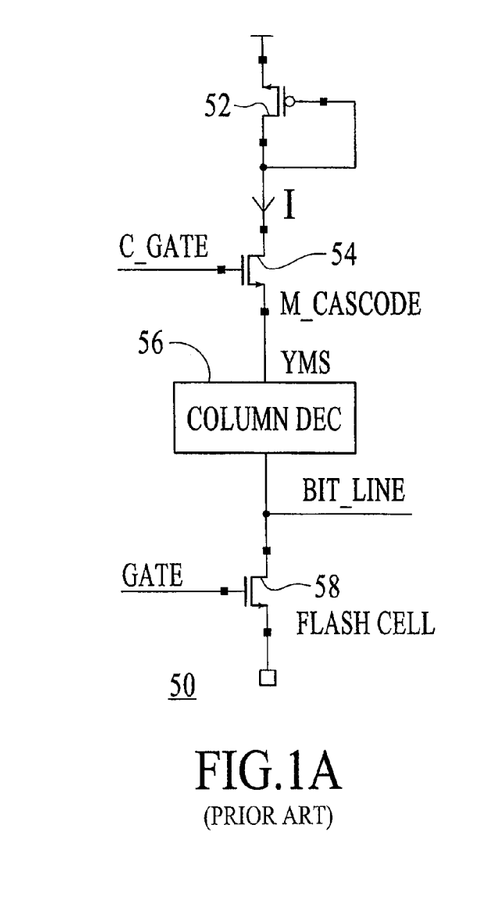
FIGS. 1A, 1B, and 1C show examples of conventional memory cell circuits.
Figure 1B:
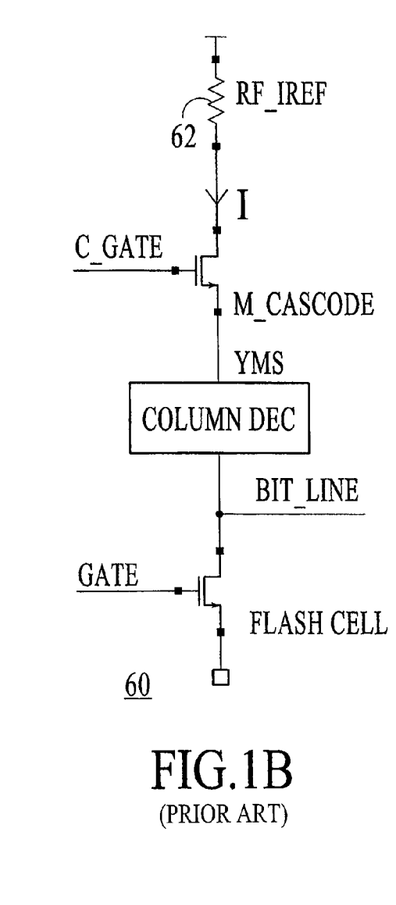
Figure 1C:
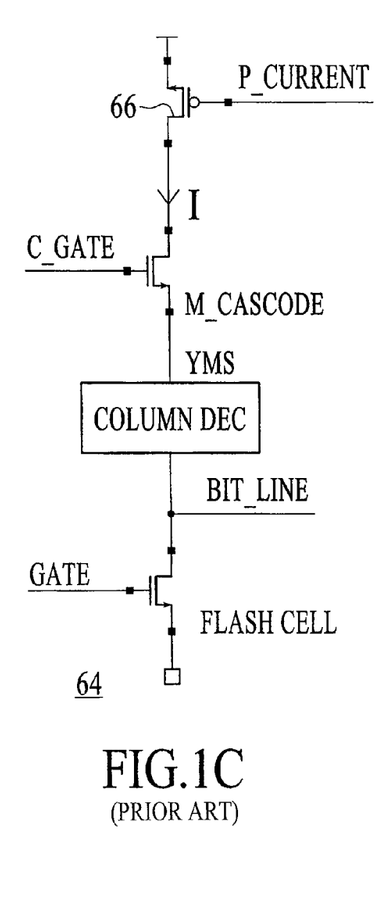

FIGS. 1A, 1B and 1C show examples of conventional memory cell circuits 50, 60 and 64, respectively. The memory cell circuit 50 includes a load transistor 52, a cascode transistor 54, a column decoder 56, and a flash cell or memory cell 58. As FIG. 1A shows, the load transistor 52 is a diode configured P-channel load. FIG. 1B shows an example of a memory cell circuit 60, which is similar to that of FIG. 1A except that the memory cell circuit 60 includes a load resistor 62 instead of a load transistor. Similarly, FIG. 1C shows an example of a memory cell circuit 64, which is similar to that of FIG. 1A except that the memory cell circuit 64 includes a current load (transistor 66) instead of a P-channel load. For ease of illustration, only one memory cell is shown in FIGS. 1A-1C. In a memory array, multiple memory cells are typically arranged in a column with their drains connected together.

Figure 2A:
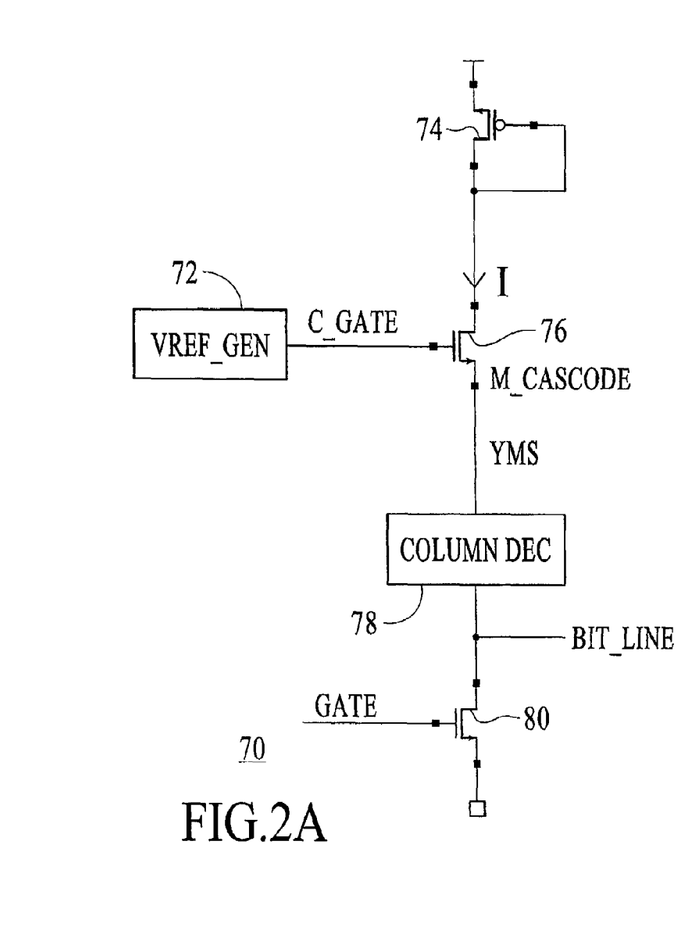
FIGS. 2A and 2B show examples of memory cell circuits in accordance with two embodiments.
Figure 2B:
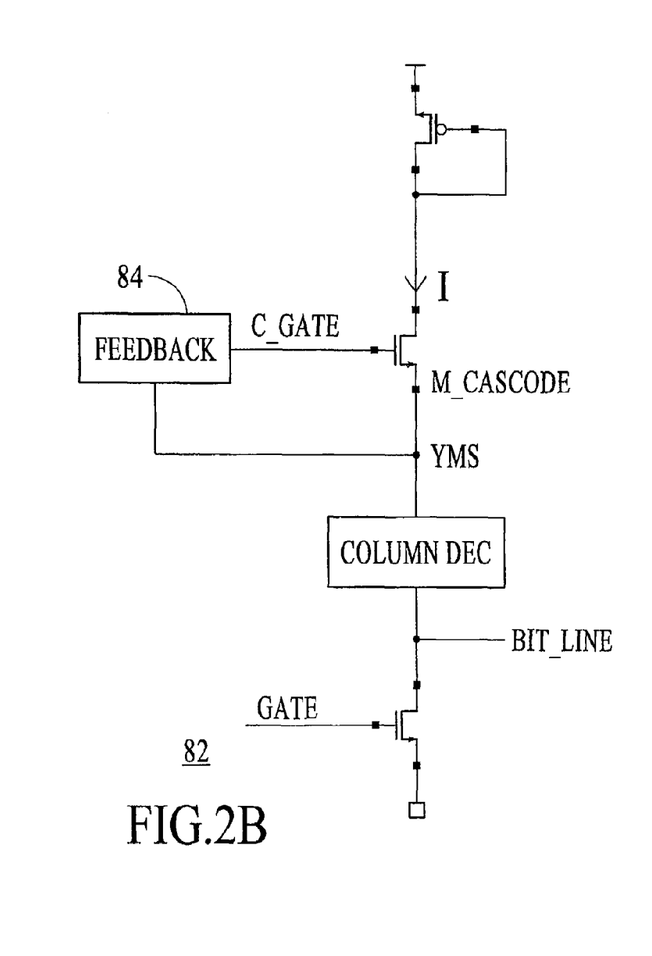

In operation, the memory cell circuit 60 sinks current to the bitline of a selected memory cell 58. Current passes through the cascode transistor 54. The memory cell circuit 60 ideally brings the voltage at the drain of the memory cell to a predefined value (e.g., about 1V) as soon as possible. However, the memory cell circuit needs to prevent the voltage (at the drain) from going over the predefined value, because going over the value may cause the status of the memory cell to change. Consequently, after a reading, an erased memory cell may become programmed. Accordingly the memory cell circuit 60 is operable to limit or fix the maximum value at the drain of the memory cell 58. This may be achieved by biasing the signal YMS going into the column decoder 56 and to the selected bitline in order to polarize and limit the voltage at the drain of the memory cell 58. FIGS. 2A and 2B provide example ways of controlling the signal YMS. However, a voltage overshoot (at the drain) with respect to the target value (e.g., 1V) may occur due to, for example, the high current sunk by large transistors during precharge phase. A significant voltage overshoot with the voltage at the drain exceeding the predefined value (e.g., 1V) may still be able to change the status of the memory cell inducing a permanent error. Also, even without changing the status of the cell, a significant voltage overshoot may cause a sense circuitry fail reading. Accordingly, embodiments fix a safe voltage value for the cell drain, and with respect to it, also prevent significant voltage overshoots at the drain of the selected cell (or reference cell).

FIG. 2A shows an example of a memory cell circuit 70 in accordance with one embodiment. The memory cell circuit 70 is similar to that of FIG. 1A except that the memory cell circuit 70 of FIG. 2A includes a reference voltage generator 72. The memory cell circuit 70 also includes a load 74, a cascode transistor 76, a column decoder 78, and a memory cell 80. In operation, the reference voltage generator 72 provides a fixed voltage at the gate of the cascode transistor 76. This fixed voltage may function to limit the maximum value of the signal YMS going into the column decoder 78, and thus limits maximum bitline value during a read.

FIG. 2B shows an example of another memory cell circuit 82 in accordance with another embodiment. The memory cell circuit 82 is similar to that of FIG. 2A except that the memory cell circuit 82 of FIG. 2B includes a feedback unit 84 instead of a reference voltage generator. The feedback unit 84 provides a voltage at the gate of the cascode transistor 76. This voltage may function to limit the maximum value of signal YMS, and thus limits maximum bitline value during a read. While a cascode transistor that is driven by a reference voltage generator (FIG. 2A) is slower than one driven by a feedback unit (FIG. 2B), using the feedback unit is more sensitive to bitline overshoots and oscillations.

Fast polarization of a memory cell enables fast access time and thus better performance. As mentioned above, there are various ways to implement drain polarization and still remain within the spirit and scope of the present invention.

Figure 3:
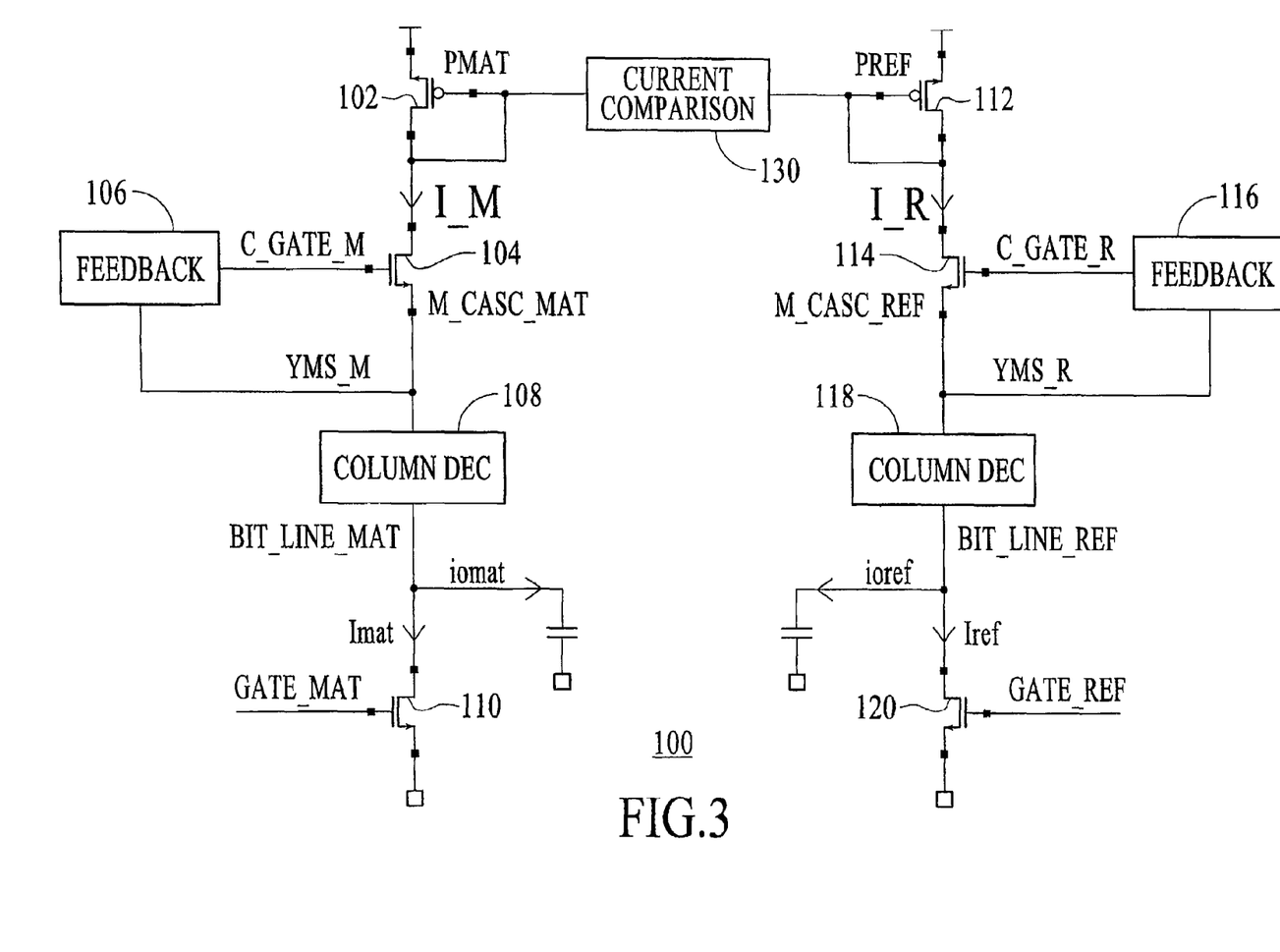
FIG. 3 shows an example of a sensing circuit in accordance with one embodiment.

FIG. 3 shows an example of a sensing circuit 100 in accordance with one embodiment. The sensing circuit 100 includes a memory cell circuit having a load transistor 102, a cascode transistor 104, a feedback unit 106, a column decoder 108, and a memory cell 110. The sensing circuit system 100 also includes a reference cell circuit having a load transistor 112, a cascode transistor 114, a feedback unit 116, a column decoder 118, and a reference cell 120. The memory cell system also includes a current comparison unit 130, which couples the load transistors 102 and 112.

As described in more detail below, to correctly read a selected memory cell, the sensing circuit needs to correctly compare a current Imat of the memory cell (e.g., memory cell 110) to a current Iref of a reference cell (e.g., reference cell 120). The current Imat is the static current of the memory cell 110 when its gate and drain are polarized to the appropriate values. The current Icmat is the global capacitance current needed to charge the bitline to the appropriate value. Icmat is >0 during an initial transient period until bitline is charged to the correct value. In one embodiment, the current Iref is the static current of the reference cell 120 when its gate and drain are polarized to the appropriate values. The current Icref is the global capacitance current needed to charge the reference bitline to the appropriate value. Icref is >0 during an initial transient period until bitline is charged to the correct value. There may be various types of reference cells (e.g., flash cells, current generators, mirrors, transistors, etc.) and the specific type used would depend on the type of operation. For ease of illustration, a scenario utilizing a read operation in a single-level device with a flash reference cell will be described. Embodiments may also apply to other types of sense architectures and types, matrix cell and reference cell paths, operations such as read/verify operations, multilevel operations, different types of reference current operations, etc.

In a read operation, if the selected memory cell sinks more current than the reference cell, the state of the memory cell is determined to be erased (i.e., the memory cell stores a one bit). Otherwise, if the selected memory cell sinks less current than the reference cell, the state of the memory cell is determined to be programmed (i.e., the memory cell stores a zero bit). In other words, if Imat>Iref, the stored bit value is "1". Otherwise, the stored bit value is "0".

In one embodiment, to obtain the Imat and Iref current information, the current comparison unit 130 of the sensing circuit 100 may compare the current I_M that the load transistor 102 sinks to the current I_R that the load transistor 112 sinks. In one embodiment, the current I_M=Imat+Icmat, which is also the current passing through the cascode transistor 104. The current I_R=Iref+Icref, which is also the current passing through the cascode transistor 114.

In one embodiment, the current comparison unit 130 performs a compare operation based on the following calculation:

$$I\_M - I\_R \text{ (or, (Imat+Icmat)} - \text{(Iref+Icref))}.$$

In one embodiment, in order to correctly read the current information, the difference between I_M and I_R has the same sign as the difference between Imat and Iref.

In one embodiment, there may be a precharge phase and an evaluation phase associated with the compare operation. The precharge phase is a time period during which the memory cell 110 is driven to its correct polarization point (e.g., the time needed to precharge the drain of the memory cell 110 (e.g., to about 1V)). In one embodiment, during a precharge phase, large transistors of the sensing circuit sink a very large current to quickly precharge all column path capacitances (in particular the bitline capacitance).

The evaluation phase is a time period during which the current comparison unit 130 performs the current comparison between the currents I_M and I_R. During an evaluation phase, in order to match the very low current that the memory and reference cells sink, large sense amplifier transistors associated with the bitlines typically operate close to their turn-off points. In one embodiment, the evaluation phase begins after that precharge phase has been completed or at least when the residual capacitances currents (Icmat and Icref) from the precharge phase cannot destroy the correct information.

In some cases, the current Icref may be different from the current Icmat. Accordingly, in one embodiment, the current comparison unit 130 may perform the comparison operation after the precharge phase is completed. After the precharge phase, the currents Icmat and Icref are the same, since Icmat=0 and Icref=0. Accordingly, performing the comparison operation after the completion of the precharge phase ensures a correct calculation of Imat−Iref. Also, in cases where capacitance matching between the bitline capacitance of the memory cell 110 and the bitline capacitance of the reference cell 120 is obtained, a certain amount of time may be needed to obtain the correct current differential (i.e., the difference between Imat and Iref). This is particularly important if the current of the sense circuitry is in the range of few microamperes, while the bitline capacitance current is in the range of several tens of microamperes. In this case, the cascode transistors 104 and 114 and load transistors 102 and 112 need to be substantially large enough to quickly precharge large bitlines. This may also result in a longer time to match the very low current of the memory cells.

In one embodiment, the final part of precharge phase may be long, because large transistors have to reach a certain polarization point in order to be able to sink a very low current (e.g., currents Imat or Iref). Because the cascode transistors 104 and 114 and the load transistors 102 and 112 are large, the polarization point may be near the turn off points of the cascode transistors 104 and 114 and load transistors 102 and 112. This is particular critical for cascode transistors due to fact that the load capacitance connected to their source may be large.

Two potential problems may arise during the compare operation described above. First, when reading a programmed memory cell (e.g., reading a zero bit), the memory cell does not sink current. In other words, the static current Imat of the memory cell is zero. However, the cascode transistor 104 (and the load transistor 102) sink a substantial amount of current Icmat in order to quickly precharge the selected bitline. It would take a substantial amount of time to charge the bitline to the appropriate value. Due to the large sizes of the cascode transistor 104 and to the big bitline capacitance, the current of the cascode transistor 104 takes a long time before coming to zero and thus to turn off. The cascode transistor 104 operates near its turn-off point during the final part of the precharge phase. Accordingly, with a big bitline capacitance to charge, it takes a long time before the cascode transistor turns off. The same problem is also possible when reading an erased cell and its static current is very low.

Accordingly, the current comparison unit detects the memory cell current plus the precharge spurious current, which may be comparable with the current of an erased memory cell (e.g., reading a one bit) when the memory cell is actually programmed. A spurious current is the possible residual capacitance current Icmat after the precharge phase and during evaluation phase. If the amount of this current is comparable to the current of an erased cell, there would be a risk that even if the selected memory cell is programmed (i.e., Imat=0), the sense circuit would compare Imat+Icmat>0 and this value could be greater than of Iref+Icref. Consequently, there would be a reading failure (e.g., reading a "1" as a programmed cell). Accordingly, evaluating the current I_M without waiting a sufficient amount of time may cause read fail. While waiting a certain amount of time may avoid such an error, waiting may impact performance (e.g., access time). This is particularly critical in the case of a cascode with a fixed gate (see FIG. 2A).

Figure 4:
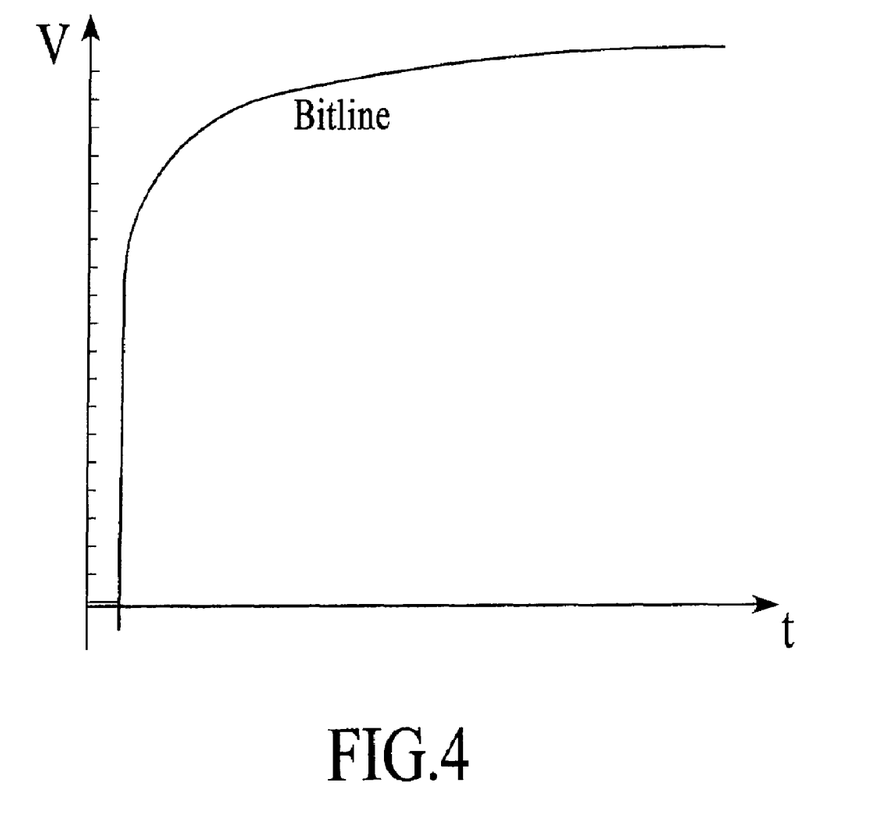
FIG. 4 shows example behavior of a bitline of a programmed memory cell during a precharge phase.

FIG. 4 shows example behavior of a bitline of a programmed memory cell during a precharge phase. In this case, the current comparison unit 130 determines the current I_M, where I_M=Imat+Icmat. As FIG. 4 shows, the time to completely charge the bitline to a static value may be very long. During this time, the current Icmat is not negligible and, in fact, may be greater than Iref. A read fail could happen during the evaluation phase, where I_M (i.e., Imat+Icmat) is determined to be greater than I_R (i.e., Iref+Icref), even if Imat=0 and is less than Iref. To avoid such a failure, a sufficient time is needed, which, as described above, significantly impacts performance. This is particularly important where the current Icmat is different from the current Icref.

The second problem may arise when reading an erased memory cell (e.g., reading a "1" bit), in particular when the memory cell sinks a low current. A YMS/bitline voltage overshoot induced, for example, in precharge phase, during the reading of an erased cell can be very risky, because the cascode transistor 104, in this case, may also be turned off during evaluation phase. Accordingly, it can take a substantial amount of time to turn the cascode transistor on again and to allow it to sink the same amount of current as the erased memory cell in order to obtain the correct current reading. As described above, to speed up the precharge phase, large cascode transistors may be implemented to quickly precharge bitlines. This risk is particularly critical in the case where feedback circuitry is used and the gate of the cascode transistor is not fixed, where a voltage overshoot at the gate may cause a YMS/bitline voltage overshoot, which may cause the cascode transistor to be turned off. In one embodiment, during an overshoot period, the feedback unit 106 may turn off the cascode transistor 104 in order to stop charging the bitline. However, the current comparison unit 130 may erroneously detect zero current from the matrix/array side even if an erased memory cell is sinking current. This problem continues until the current of erase cell is able to discharge the bitline to a correct value that enables the cascode transistor 104 to turn on. If the erased cell current is low, a significant time is needed to discharge the big bitline capacitance.

To be in the evaluation phase before the cascode transistor 104 turns on again may result in a read fail. In fact, during a bitline overshoot, the current I_M=Id (cascode transistor 104)=0, and current I_M≠Imat+Icmat. Accordingly, the current I_M−I_R=0−Iref−Icref<0, even if Imat>Iref. Accordingly, the memory cell would be erroneously determined to be programmed, while the memory cell is actually erased. When there is a large bitline capacitance and a very low current, the discharge phase can be very long. In this embodiment, the same problem may also occur on the reference side where a reference bitline overshoot could turn off cascode transistor 114.

Accordingly, the current comparison unit 130 needs to wait until the YMS_M/bitline_mat and YMS_R/bitline_ref are set to the right values in order to correctly read the memory cell, which significantly impacts performance. Moreover, due to the fact that the large cascode and load transistors at the end of the precharge phase and during the evaluation phase must work near their turned off polarization point in both erased and programmed cell cases, these transistors may be very slow.

Figure 5:
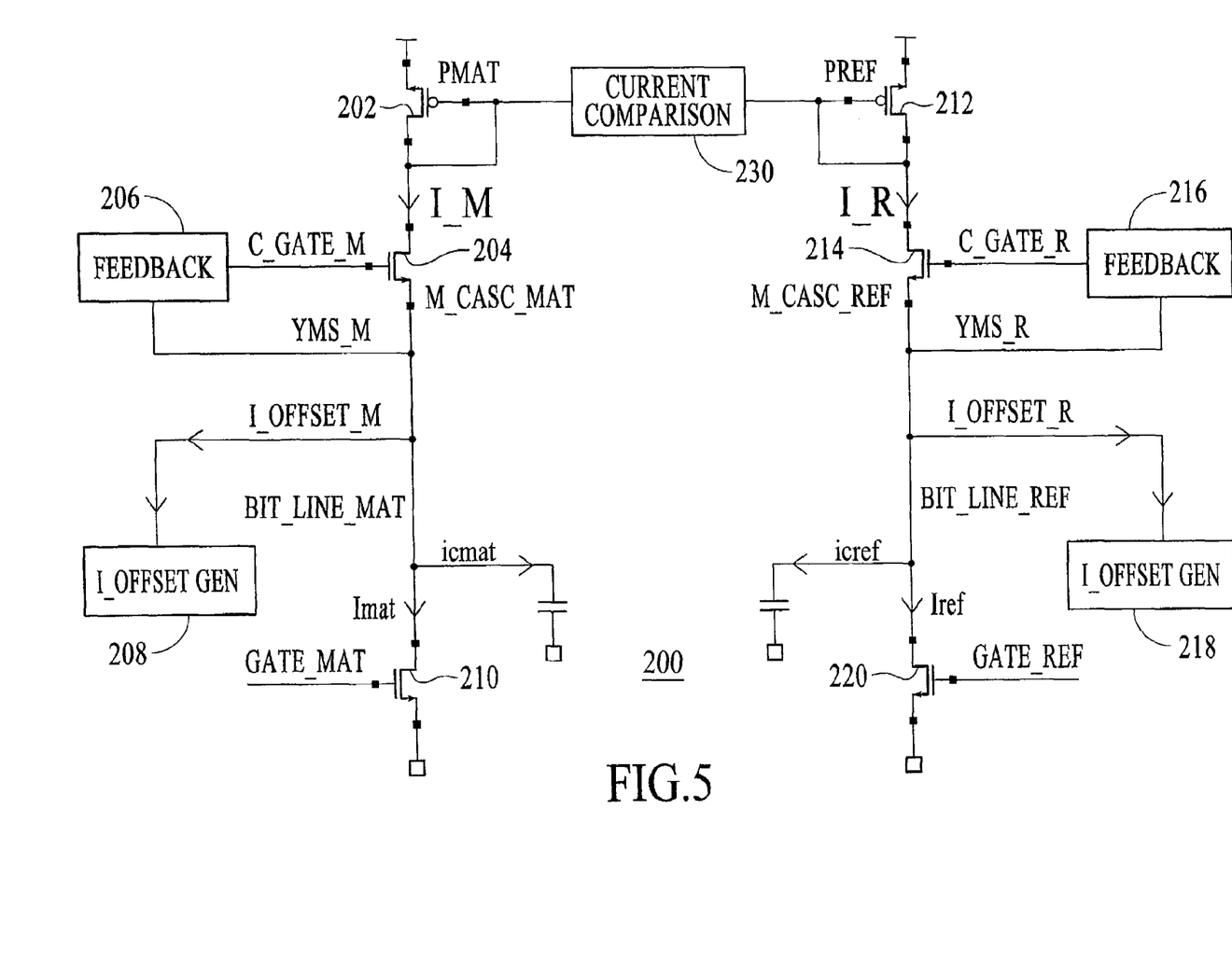
FIG. 5 shows an example of a sensing circuit in accordance with another embodiment.

FIG. 5 shows an example of a sensing circuit 200 in accordance with another embodiment. The sensing circuit 200 includes a memory cell circuit having a load transistor 202, a cascode transistor 204, a feedback unit 206, a column decoder unit 207, an offset unit 208, and a memory cell 210. The sensing circuit 200 includes a memory cell circuit having a load transistor 212, a cascode transistor 214, a feedback unit 216, a column decoder unit 217, an offset unit 218, and a memory cell 220. The memory cell system also includes a current comparison unit 230, which couples to the load transistors 202 and 212.

This is, however, only one possible implementation. For example, offset units may be connected at several other points of this embodiment and could be efficiently used in many different kinds of sense architectures, references and matrix cell types and paths, etc.

The sensing circuit 200 operates similarly to the sensing circuit 100 described above except that the sensing circuit 200 avoids the issues described above by incorporating the offset units 208 and 218. As shown in FIG. 5, the offset units 208 and 218 offset the currents of their respective bitlines. The offset current I_offset_M is the offset current added to the memory bitline path, while the current I_offset_R is the offset current added to the reference bitline path. The cascode transistors 204 and 216 also sink these offset currents.

The offset units 208 and 218 enable the sensing circuit 200 to quickly set YMS_M/BIT_LINE_MAT and YMS_R/BIT_LINE_REF to their respective correct voltage value in order to more quickly complete a precharge phase so that an evaluation phase can begin sooner.

In one example, for ease of illustration, assume that I_offset_M=I_offset_R=I_offset, and that all of these currents are on during access time. On the reference cell side, I_R=Iref+Icmat+I_Offset. On the memory cell side, I_M=Imat+Icmat+I_offset. Setting I_offset values and using appropriate times to turn on the offset units 208 and 218, enables the large cascode and load transistors to operate at their optimum polarization points to significantly speed them up. This would be true in the case where the precharge capacitance current of the reference cell side is identical to the precharge capacitance current of the memory cell side. This would also be particularly true in the case where the precharge current of the reference side is significantly different from the precharge current of the memory cell side.

Figure 6:
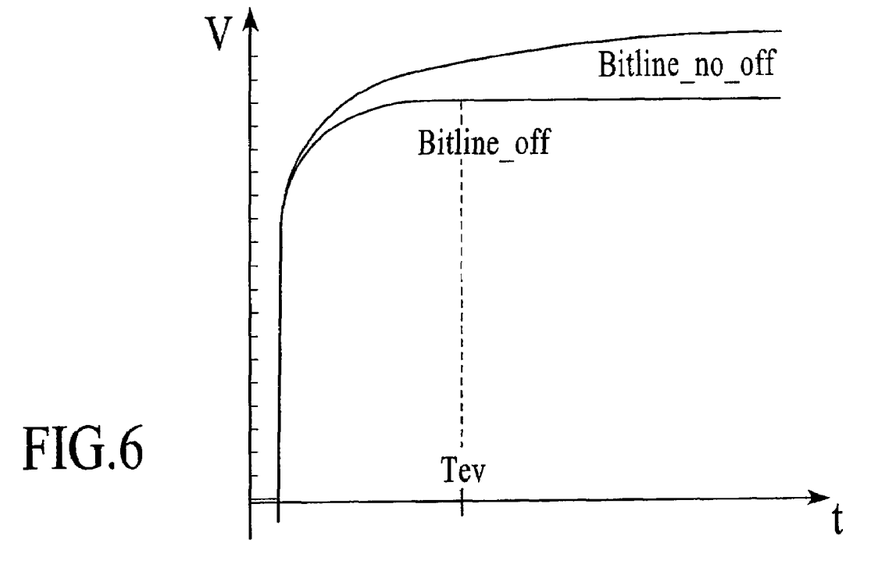
FIG. 6 shows example behavior of a bitline of a programmed memory cell during a precharge phase using and not using current offset units.

FIG. 6 shows example behavior of a bitline of a programmed memory cell during a precharge phase using and not using current offset units. FIG. 6 shows example behavior of the sensing circuit 200 of FIG. 5 and may be compared with the example behavior of the sensing circuit of FIG. 3. In one embodiment, cascode transistors with fixed gates are used (as in FIG. 2A). As FIG. 6 shows, the time Tev takes to precharge the bitline of a programmed memory cell with the current offset (labeled "Bitline_off") is substantially faster than the time to precharge the bitline of the programmed memory cell without the current offset (labeled "Bitline_no_off"). Using the current offset is not only is faster, but it is also more stable (i.e., less sensitive to oscillations) and provides a current capacitance current that is substantially zero much of the time as opposed to the case without the offset current. This is particularly beneficial in cases where a global reference capacitance is very low and the current Icref is negligible.

The following example describes a scenario without the current offset. When reading a programmed cell and assuming that the evaluation phase begins at time t=Tev, the current I_R=Iref+Icref, where, for example, Icref=0. The current I_M=Imat+Icmat. The current differential information, or Current Delta, =Iref+Icref−(Imat+Icmat). If the selected memory cell is programmed such that Imat=0, the Current Delta=Iref−Icmat. This is due to the fact that at t=Tev, the precharge bitline phase has not completed (i.e., Icmat is not=0). This could result in the Current Delta being negative (especially when Iref is a very low current), which would be an incorrect determination. To avoid this problem, the current comparison unit 230 would have to wait a substantial amount of time (i.e., greater than Tev) to correctly read the memory cell.

In contrast to the scenario above, the current offset enables the current comparison unit 230 to correctly read at t=Tev. At that time, I_R=Iref+Icref+I_offset, where Icref=0, I_M=Imat+Icmat+I_offset, where t=Tev and Icmat=0, and the Current Delta=(Iref+I_offset+Icref)−(Imat+I_offset+Icmat)=(Iref+Icref)−(Imat+Icmat)=Iref−Imat. If the selected memory cell 210 is programmed, Imat=0. Accordingly, the Current Delta=Iref>0, which would be correct.

While the current offset units 208 and 218 optimize polarization of the cascode transistors 204 and 214 and of the load transistors 202 and 212, the current offset units 208 and 218 also facilitate completion of the precharge phase so that the evaluation phase may begin much sooner. This enables more accurate current readings and significantly reduces access time. This would be true with or without capacitance matching between the memory bitline and the reference bitline. This would also be true with or without a fixed gate for the cascode transistors. For example, referring still to FIG. 5, assume good capacitance matching between the memory bitline and the reference bitline (i.e., Icref=Icmat). Also, assume that the memory cell 210 is being read such that Imat=0. The correct Current Delta is Iref−Imat=Iref.

Figure 7:
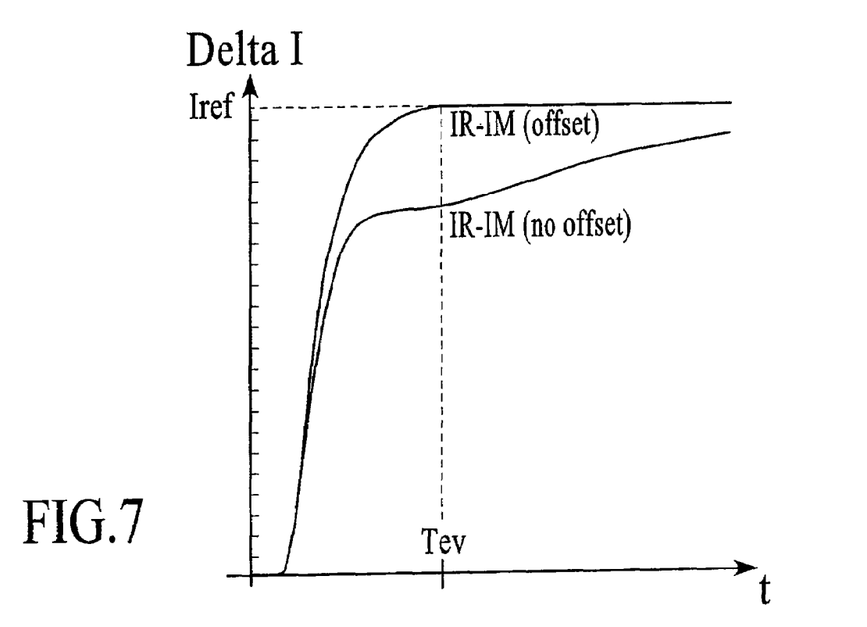
FIG. 7 shows example results using current offset units compared to not using current offset units.

FIG. 7 shows example results using the current offset units 208 and 218 compared to not using the current offset units 208 and 218. As FIG. 7 shows, the current offset static information reaches the reference current Iref (Delta I=Iref) significantly faster (e.g., t=Tev) in the case where the current offset is utilized, as compared with the case where the offset current is not utilized. Also, as FIG. 7 shows, the maximum Current Delta is achieved at time t=Tev using the current offsets, while much waiting time is required when obtaining the same Current Delta in the case without the current offsets. The same is true whether reading an erased memory cell or a programmed memory cell.

Moreover, during the evaluation phase, the current offsets speed up involved internal nodes, which decreases the access time thereby improving performance. This is particularly useful in cases where the capacitance currents are not the same on the memory cell side and the reference cell side. Even when there is good matching between precharge capacitance currents, evaluation nodes operating at a faster transistor polarization point are significantly faster.

Another benefit is that the offset units 208 and 218 reduce the risk of erroneously turning off a cascode transistor while reading an erased cell. As indicated above, fast feedback cascode circuitry can induce a fail or may require a long wait time before reading correctly. Due to the offset currents, the risk of a voltage overshoot is significantly reduced. However, in the case where a voltage overshoot would occur, the time needed to recover the right cascode behavior is significantly less than without the offset currents. The bitline (of array/matrix side or of reference side) after an overshoot has to be discharged to the correct static polarization point needed to allow the feedback circuitry to turn cascode transistor 204 (on the matrix side) or the cascode transistor 214 (on the reference side) back on. In the case without the offset currents, the only current that could discharge the bitline capacitance is the same selected memory cell current, which is very low. However, in the case with the offset currents, the matrix side capacitance may be discharged by both the offset current of the offset units 208 and by the memory cells 210. The reference side capacitance may be discharged by both the offset current of unit 218 and by the reference cell 220 current. Accordingly, the offset units 208 and 218 shorten the time needed to wait to read correctly.

According to the system disclosed herein, the present invention provides numerous benefits. For example, embodiments of the present invention improve operations of sense amplifiers by improving both precharge and evaluation phases and enabling significantly reduced access times. This benefit is particularly useful in NAND memories where the currents in memory cells are very low and bitline capacitances very large. Embodiments of the present invention also reduce access times when reading memory cells.

A sensing circuit has been disclosed. The sensing circuit includes a memory circuit that has an offset circuit that offsets the current of a selected memory cell and includes a reference circuit that has an offset circuit that offsets the current of a reference cell. The sensing circuit also includes a compare circuit that compares the current of the selected memory cell to the current of the reference cell, where the difference between the currents determines the state of the memory cell (i.e., whether the memory cell is programmed or erased). As a result, the offset circuits offset the currents of the memory cell and the reference cell such that the offset currents can significantly speed up, during both precharge and evaluation phase, cascode transistors and load transistors in the sensing circuit in a quick and efficient manner and prevent current overshoots at the memory cell.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A sensing circuit comprising:
   a memory circuit comprising a first offset circuit coupled to a memory cell and operable to offset a first current, the memory circuit including a first load element, and a first cascode transistor coupled to the first load element and the memory cell;
   a reference circuit including a second offset circuit operable to offset a second current; and
   a compare circuit coupled to the memory circuit and the reference circuit and configured to determine a state of the memory cell based on a calculated difference between the first current and the second current, the compare circuit being operable to perform a pre-charge phase that includes polarizing the memory cell, and an evaluation phase to calculate the difference, wherein the first offset circuit is operable to offset the first current in order to drive the memory cell to a polarization point, and wherein the memory circuit comprises a first bias circuit coupled to the first cascode transistor and operable to limit a voltage at a drain of the memory cell.

2. The circuit of claim 1 wherein the reference circuit comprises:
   a second load element;
   a second cascode transistor coupled to the second load element;
   a reference cell coupled to the second cascode transistor, wherein the second offset circuit is coupled to the reference cell and operable to offset the second current in order to polarize the reference cell.

3. The circuit of claim 2 wherein the reference circuit further comprises a second bias circuit coupled to the second cascode transistor and operable to limit a voltage at a drain of the reference cell.

4. The circuit of claim 1 wherein the compare circuit is operable to compare the first current with the second current after the precharge phase.

5. The circuit of claim 1 wherein the first and second offset circuits are operable to speed up respective cascode and load transistors in the memory circuit and in the reference circuit.

6. A system comprising:
   a processor
   a memory circuit coupled to the processor that includes a first offset circuit operable to offset a first current and coupled to a memory cell, the memory circuit including a first load element, and a first cascode transistor coupled to the first load element, wherein the memory cell is coupled to the first cascode transistor, and the first offset circuit is operable to offset the first current in order to polarize the memory cell, the memory circuit further comprising:
   a first bias circuit coupled to the first cascode transistor, wherein the first bias circuit is operable to limit a voltage at a drain of the memory cell;
   a reference circuit including a second offset circuit operable to offset a second current; and
   a compare circuit coupled to the memory circuit and the reference circuit, wherein the compare circuit determines a state of the memory cell based on a calculated difference between the first current and the second current, the compare circuit being further operable to perform a pre-charge phase that includes polarizing the memory cell, and an evaluation phase to calculate the difference.

7. The system of claim 6 wherein the reference circuit comprises:
   a second load element;
   a second cascode transistor coupled to the second load element;
   a reference cell coupled to the second cascode transistor; and
   wherein the second offset circuit is coupled to the reference cell, and wherein the second offset circuit is operable to offset the second current in order to polarize the reference cell.

8. The system of claim 7 wherein the reference circuit further comprises a second bias circuit coupled to the second cascode transistor, wherein the second bias circuit is operable to limit a voltage at a drain of the reference cell.

9. The system of claim 6 wherein the compare circuit is operable to compare the first current with the second current after the precharge phase.

10. The system of claim 6 wherein the first and second offset circuits are operable to speed up respective cascode and load transistors in the memory circuit and in the reference circuit.

11. A method comprising:
    offsetting a first current of a memory circuit;
    offsetting a second current of a reference circuit;
    determining a state of a memory cell based on a calculated difference between the first current and the second current, wherein determining the state includes performing a pre-charge phase that includes polarizing the memory cell, and an evaluation phase to calculate the difference; and
    limiting a voltage at a drain of the memory cell.

12. The method of claim 11 wherein the offsetting of the first current is performed by a first offset circuit, and wherein the offsetting of the second current is performed by a second offset circuit.

13. The method of claim 11 further comprising comparing the first current with the second current after the precharge phase.

* * * * *

UNITED STATES PATENT AND TRADEMARK OFFICE
CERTIFICATE OF CORRECTION

PATENT NO. : 7,782,695 B2  Page 1 of 1
APPLICATION NO. : 11/652742
DATED : August 24, 2010
INVENTOR(S) : Lorenzo Bedarida et al.

It is certified that error appears in the above-identified patent and that said Letters Patent is hereby corrected as shown below:

In column 10, line 2, in Claim 6, after "processor" insert -- ; --.

Signed and Sealed this

Ninth Day of November, 2010

David J. Kappos
*Director of the United States Patent and Trademark Office*